United States Patent
Dai et al.

(10) Patent No.: US 8,956,978 B1
(45) Date of Patent: Feb. 17, 2015

(54) SEMICONDUCTOR DEVICE, METHOD FOR MANUFACTURING SEMICONDUCTOR SINGLE-WALLED NANOTUBES, AND APPROACHES THEREFOR

(75) Inventors: Hongjie Dai, Cupertino, CA (US); Guangyu Zhang, Palo Alto, CA (US); Pengfei Qi, Palo Alto, CA (US)

(73) Assignee: The Board of Trustees of the Leland Stanford Junior Univerity, Palo Alto, CA (US)

( * ) Notice: Subject to any disclaimer, the term of this patent is extended or adjusted under 35 U.S.C. 154(b) by 889 days.

(21) Appl. No.: 11/830,509

(22) Filed: Jul. 30, 2007

Related U.S. Application Data

(60) Provisional application No. 60/834,509, filed on Jul. 31, 2006.

(51) Int. Cl.
*H01L 21/336* (2006.01)
*H01L 21/36* (2006.01)
*H01L 51/00* (2006.01)
*H01L 51/05* (2006.01)

(52) U.S. Cl.
CPC ........ *H01L 51/0048* (2013.01); *H01L 51/0558* (2013.01)
USPC ............ 438/710; 438/715; 438/197; 438/308

(58) Field of Classification Search
CPC ....................... H01L 51/0048; H01L 51/0558
USPC .......... 438/197, 199, 710, 715, 308; 977/750–751, 856, 938, 742, 842
See application file for complete search history.

(56) References Cited

U.S. PATENT DOCUMENTS

| | | | |
|---|---|---|---|
| 7,091,096 B2 | 8/2006 | Balasubramanian et al. | |
| 7,141,727 B1 | 11/2006 | Appenzeller et al. | |
| 8,222,127 B2 * | 7/2012 | Marsh et al. | 438/507 |
| 8,624,225 B2 * | 1/2014 | Marsh et al. | 257/29 |
| 2004/0023514 A1 * | 2/2004 | Moriya et al. | 438/778 |
| 2007/0280875 A1 * | 12/2007 | Fischer et al. | 423/447.1 |

OTHER PUBLICATIONS

C.M- Yang et al., Preferential Etching of Metallic Single-Walled Carbon Nanotubes with Small Diameter by Fluorine Gas, 2006, Physical Review B73, pp. 075419-1 to 075419-7.*
A. Hassanien et al., Selective Etching of Metallic Single-Wall Carbon Nanotubes With Hydrogen Plasma, 2005 Institute of Physics Publishing, Nanotechnology 16, pp. 278-281.*

* cited by examiner

*Primary Examiner* — Anh Mai
(74) *Attorney, Agent, or Firm* — Crawford Maunu PLLC

(57) ABSTRACT

Nanotube devices and approaches therefore involve the formation and/or implementation of substantially semiconducting single-walled nanotubes. According to an example embodiment of the present invention, substantially semiconducting single-walled nanotubes couple circuit nodes in an electrical device. In some applications, semiconducting and metallic nanotubes having a diameter in a threshold range are exposed to an etch gas that selectively etches the metallic nanotubes, leaving substantially semiconducting nanotubes coupling the circuit nodes.

14 Claims, 5 Drawing Sheets

SEMICONDUCTOR DEVICE, METHOD FOR MANUFACTURING SEMICONDUCTOR SINGLE-WALLED NANOTUBES, AND APPROACHES THEREFOR

RELATED PATENT DOCUMENTS

This patent document claims the benefit, under 35 U.S.C. §119(e), of U.S. Provisional Patent Application No. 60/834,509 filed on Jul. 31, 2006 and entitled: "Semiconducting Single-Walled Nanotubes and Approaches Therefor" (which is fully incorporated herein by reference).

FIELD OF THE INVENTION

The present invention relates generally to single-walled nanotubes and more particularly to the manufacture and use of single-walled carbon nanotubes as part of electronic circuits.

BACKGROUND

Single-walled nanotubes (SWNTs) are unique molecular structures that exhibit interesting and useful properties and may be utilized for a variety of devices. SWNTs have a cylindrical sheet-like, one-atom-thick shell of hexagonally-arranged atoms.

SWNTs have been used in a variety of applications that are increasing in number and diversity as their manufacture and implementation becomes more widespread. For instance, single-walled carbon nanotubes have been increasingly considered for and/or used with advanced electronics applications. Carbon-based SWNTs are hollow structures composed, at least partially, of carbon atoms. Single-walled carbon nanotubes can be doped with other elements such as metals, boron and nitrogen. Such SWNTs are increasingly being used as conductors (e.g., nanowires) and to form electronic components such as field effect transistors (FETs), switches and others.

While the use of carbon nanotubes in electrical applications is growing, there are many challenges to the implementation of nanotubes for a variety of such applications. For instance, one challenge to the implementation of carbon nanotubes, and particularly to the implementation of SWNTs, relates to the tendency of SWNTs to grow in a manner that exhibits metallic and semiconducting mixtures due to various chiralities (e.g., geometric characteristics). The metallic nature of nanotubes can be undesirable for a variety of applications, including those susceptible to electrical shorting.

One electrical application that is susceptible to difficulties associated with the growth of metallic nanotubes is the field-effect transistor (FET). The scalable implementation of large numbers of semiconducting SWNTs (S-SWNTs) in parallel without electrical shorting by metallic SWNTs (M-SWNT) has been particularly difficult. Such parallel S-SWNTs and their characteristics are useful for high-current and high-speed nanotube FETs.

Previous approaches to the selective synthesis of S-SWNTs have often exhibited undesirable results. For instance, some approaches result in SWNTs with undesirably small diameters or lengths due to excessive processing, making ohmic contact difficult. Approaches involving the separation of M-SWNTs have exhibited incomplete separation, which can degrade on/off ratios for electronic devices such as FETs or other switching devices. Synthesis approaches that covalently alter M-SWNTs result in M-SWNTs that are susceptible to recovery, where altered M-SWNTs become conducting again, which can cause shorts. Recover from covalent alteration or functionalization may occur, for example, during annealing steps that are often involved in device processing. Moreover, breakdown approaches (e.g., chemical or physical approaches to break undesirable M-SWNTs), have been tedious and expensive, and are thus difficult to scale to application to hundreds or thousands of nanotube-based FETs.

The above issues as well as others have presented challenges to the manufacture and implementation of nanotubes for a variety of applications.

SUMMARY

The present invention is directed to overcoming the above-mentioned challenges and others related to the types of devices discussed above and in other implementations. The present invention is exemplified in a number of implementations and applications, some of which are summarized below as examples.

According to a particular aspect of the present invention, a semiconductor device has a multitude of growth-rooted nanotubes which are present in an electrical circuit that includes circuit nodes. The semiconductor device comprises: a multitude of etched metallic-type growth-rooted nanotubes including one group that has a diameter which is above a lower limit and including another group that has a diameter which is below the lower limit; and a multitude of semiconducting-type growth-rooted nanotubes, each having a diameter that is above the lower limit and connecting respective circuit nodes.

According to various embodiments, the present invention uses a methodology that yields a desirable set of semiconducting single-walled nanotubes (S-SWNTs). In one such embodiment, this methodology produces S-SWNTs of a desirable diameter range and without any M-SWNTs that would typically cause shorts in electrical components utilizing the S-SWNTs. This methodology lends itself well to large-scale manufacturing as would be expected, for example, in most large-scale semiconductor device applications. In a more specific embodiment, one aspect of the methodology controls the growth of the SWNTs to facilitate another aspect of the methodology to remove the above-mentioned problematic M-SWNTs.

Such methodology yields semiconductor devices in which growth-rooted nanotubes of semiconducting and metallic types are formed in a nanotube growth process and the growth-rooted nanotubes of the semiconducting type are used as part of electrical components. The growth-rooted nanotubes of the semiconducting type are growth-rooted in a circuit node and of a diameter that is less than an upper limit, and include first and second subsets of the nanotubes. The nanotubes in the first subset have diameters greater than a lower limit, which is less than the upper limit, and extend between circuit nodes of the electrical components for electrically coupling the circuit nodes. The nanotubes in the second subset have diameters less than the lower limit and terminate short of providing electrical coupling between circuit nodes. In addition, a preponderance of the growth-rooted nanotubes of the metallic type have ends that are growth-rooted in respective circuit nodes, have diameters up to and not exceeding the upper limit, and terminate short of providing electrical connection from their respective ends to other circuit nodes.

In some applications, the above methodology yields semiconductor devices wherein most or all of the nanotubes of both the semiconducting and metallic types have diameters that are less than the upper limit, with at least some nanotubes of both the semiconducting and metallic types having a diameter up to and not exceeding the upper limit. In certain applications, nanotubes of both the semiconducting and metallic types extend from and/or are growth-rooted in a common circuit node. The nanotube or nanotubes of the semiconducting type electrically connect the circuit node to another circuit node, and the nanotube or nanotubes of the metallic type terminate short of providing electrical connection to the circuit node (e.g., the nanotubes of the metallic type do not undesirably electrically connect or short the circuit node to another circuit node).

In connection with another example embodiment, after the SWNTs are grown, both semiconducting and metallic SWNTs are exposed to an etch gas. The etch gas selectively etches the metallic SWNTs, leaving substantially semiconducting SWNTs behind. Electronic circuits thus formed exhibit desirable characteristics in a readily-manufactured form and are implemented for a variety of applications, such as transistors and other semiconductor devices, and in some implementations, for large-scale arrangement of a multitude of such devices (e.g., an array of field-effect transistors).

According to another example embodiment of the invention, metallic nanotubes (e.g., M-SWNTs) are etched using a high-temperature methane plasma treatment to remove at least a portion of the nanotubes from large arrays of nanotube devices. The high-temperature plasma treatment has high selectivity to S-SWNTs in a diameter range desirable for applications such as FET applications, thus removing some or all of the M-SWNTs while leaving S-SWNTs behind (e.g., with remaining portions of M-SWNTs being rendered discontinuous to mitigate any electrical shorting otherwise characterized therewith). The resulting nanotube devices exhibit relatively high current-carrying ability, and when implemented with FETs, exhibit relatively high on/off ratios.

According to another example embodiment of the present invention, a semiconductor device includes single-walled nanotubes of a semiconducting and metallic type. The single-walled nanotubes of a semiconducting type each have an end growth-rooted in a circuit node. Some of the nanotubes of the semiconducting type include nanotubes characterized as having a diameter in a range defined by a lower limit and an upper limit and as extending between circuit nodes for electrically coupling the circuit nodes. Other nanotubes of the semiconducting type are characterized as having a diameter less than the lower limit and as terminating short of providing electrical coupling between circuit nodes. The single-walled nanotubes of a metallic type are each characterized by an end growth-rooted in a circuit node, by a diameter less than the upper limit, and by termination short of providing electrical coupling between circuit nodes.

According to another example embodiment of the present invention, an electronic device includes a semiconducting single-walled nanotube to selectively couple electrodes. The device includes source and drain electrodes separated by a channel region, a control node and a dielectric material. The channel region is capacitively coupled to the control node via the dielectric and includes a semiconducting single-walled nanotube and an etched metallic single-walled nanotube fragment. The semiconducting single-walled nanotube is growth-rooted in one of the source and drain electrodes and extends to the other of the source and drain electrodes. The diameter of the semiconducting single-walled nanotube is in a range defined by an upper limit and a lower limit. The semiconducting single-walled nanotube is further responsive to the control node by selectively passing current between the source and drain electrodes. The etched metallic single-walled nanotube fragment extends from one of the source and drain electrodes and also has a diameter in a range defined by an upper limit and a lower limit. The metallic single-walled nanotube, however, provides substantially no electrical coupling between the source and drain electrodes.

According to another example embodiment of the present invention, an electrical device is manufactured. A plurality of single-walled nanotubes (SWNTs) extend between electrodes (e.g., are growth-rooted in one electrode and extend to another electrode), and include both semiconducting single-walled nanotubes (S-SWNTs) and metallic single-walled nanotubes (M-SWNTs). An etching process, such as a selective methane plasma etch process, is used to etch the M-SWNTs while retaining the S-SWNTs to electrically couple the electrodes. Via the etching, few or none (e.g., substantially none) of the M-SWNTs electrically connect the electrodes, mitigating undesirable electrical connection and/or shorting between the electrodes by way of the M-SWNTs.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

Figure 1:
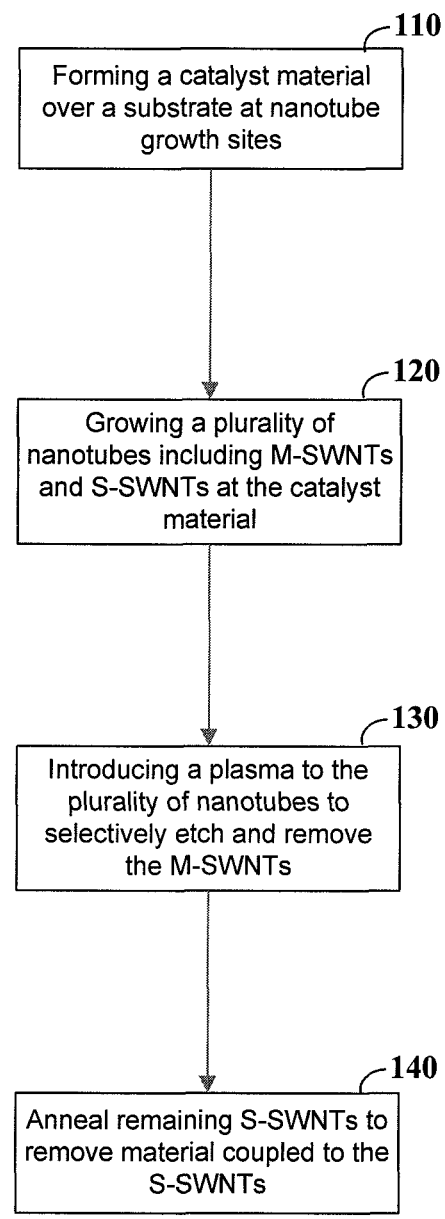
FIG. 1 shows a flow diagram for an approach to manufacturing SWNT structures, according to an example embodiment of the present invention.

While the invention is amenable to various modifications and alternative forms, various embodiments have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of nanotube-based devices, and the invention has been found to be particularly suited for implementation with switching-type applications, such as field-effect transistors (FETs), having semiconducting single-walled nanotubes (SWNTs). While the present invention is not necessarily limited to such applications, various aspects of the invention may be appreciated through a discussion of various examples using this context.

According to an example embodiment of the present invention, a multitude of SWNTs, including both a semiconducting type of SWNTs (S-SWNTs) and metallic type of SWNTs (M-SWNTs), are formed extending between conductive contacts. The S-SWNTs are substantially semiconducting, and the M-SWNTs have metallic material that is susceptible to electrical shorting the conductive contacts across which the M-SWNT extends. The SWNTs are exposed to an etchant that etches (and removes) the M-SWNTs and while leaving S-SWNTs behind (e.g., the etchant is selective to the S-SWNTs, either insubstantially etching the S-SWNTs, or not etching the S-SWNTs at all). With this approach, electronic devices such as FETs are formed with substantially semiconducting SWNT connectors extending between conductive contacts, with mitigated susceptibility to shorts via M-SWNTs.

In another embodiment, S-SWNTs that remain after etching are processed to remove material that is undesirable for electrical implementation. For instance, etching with a carbon-containing plasma (e.g., methane) may result in molecules covalently bonded to the S-SWNTs. In such applications, an anneal is carried out to remove these covalently-bonded molecules.

As referenced herein, S-SWNTs are generally amenable for switching between a relatively high current-passing state and a relatively low (or no) current-passing state (e.g., S-SWNTs are depletable in response to a sweeping bias). However, M-SWNTs generally facilitate conduction or shorting without application of such a bias (e.g., are not depletable or otherwise responsive for switching). In this regard, various embodiments of the present invention are directed to semiconductor devices having both depletable S-SWNTs and non-depletable M-SWNTs, with electrical connectivity made via the depletable S-SWNTs and the non-depletable M-SWNTs being substantially limited to non electrically-continuous M-SWNTs (i.e., broken M-SWNTs or M-SWNT fragments).

In connection with another example embodiment of the present invention, a device is manufactured having S-SWNTs in a particular diameter range, using a SWNT growth approach implemented to produce SWNTs having a diameter near a desired upper limit, and an etching approach to remove SWNTs having a diameter below a lower limit. In connection with one example embodiment, it has been discovered that growing SWNTs having a diameter less than about 2 nm, and subsequently etching the SWNTs with methane results in substantially S-SWNTs having a diameter in the range of between about 1.2 nm and 2.0 nm.

According to another example embodiment of the present invention, a carbon nanotube FET device is manufactured with two or more S-SWNTs coupling source and drain electrodes of the FET. A plurality of single-walled carbon nanotubes, including both S-SWNTs and M-SWNTs are grown extending across the source and drain electrodes. The M-SWNTs are selectively etched via hydrocarbonation using a dry chemical treatment (e.g., as described above, using methane as an etchant) to break or remove all or substantially all of the M-SWNTs (e.g., at least about 90% and, in some applications, about 100% of the M-SWNTs). After the M-SWNTs are etched, remaining S-SWNTs are annealed to remove covalently-bonded molecules. The etch is carried out at a temperature amenable to the particular application and available resources, and in some applications, at temperatures of about 400° C. Similarly, the anneal is carried out at temperatures amenable to removal of covalently-bonded molecules, and in some applications, at temperatures of about 600° C. FETs produced using these approaches exhibit relatively high on-current (e.g., greater than about 0.1 mA) and desirable on/off ratios (e.g., about $10^5$), with source-drain connection by substantially all-semiconductor SWNTs (i.e., substantially all S-SWNTs with few or no metallic SWNTs) in a desirable diameter range (e.g., between about 1.4 nm and 2.0 nm).

In many embodiments, the single-walled carbon nanotubes are grown from, and therein are rooted or growth-rooted in, a circuit node such as an electrode. In one application, a plurality of S-SWNTs and M-SWNTs are grown from and growth-rooted in a circuit node, and extend from the circuit node to another circuit node to facilitate electrical coupling of the circuit nodes. In this regard, a growth-rooted nanotube may, for example, be grown from a catalyst material at an electrode and at a first end of the nanotube, and extend to another electrode at a second end of the nanotube.

In various contexts herein, the term "substantial" is used in a variety of manners, including use in connection with a characterization of nanotubes that are etched, not etched, grown, or characterized as having a diameter as above or below a threshold. In this regard, the term substantial is used, in connection with some example embodiments, to mean all or nearly all (e.g., 90%, 98% or 100%) of nanotubes in the context used. For instance, relative to a nanotube-based field-effect transistor (FET), many embodiments are directed to such transistors implementing nanotubes of the semiconducting type (e.g., nanotubes that selectively pass current or switch a device ON and OFF between high current passing and low (or no) current passing states in response to a bias). In some of these FET applications, substantially none of or no nanotubes of the metallic type couple circuit nodes (e.g., few, if any M-SWNTs undesirably short circuit nodes). In other of these FET applications, substantially none (e.g., less than a few percent, or zero) of the M-SWNTs have diameters greater than an upper limit over which the M-SWNTs are not susceptible to an etch used to break or remove M-SWNTs characterized by a diameter less than the upper limit.

For a given manufacturing application, one skilled in the art would recognize that the term "substantial" varies depending on the defect tolerance permitted; for example, for a manufacturing application permitting a defect tolerance of about 3%, the term "substantially all nanotubes . . . [that would not be expected to cause defects]" refers to at least about 97% of such nanotubes, whereas the same term would not refer to less than about 97%.

In other manufacturing applications, a relatively greater defect tolerance of about 20% is used, wherein the term "substantially all nanotubes . . . [that would not be expected to cause defects]" refers to at least about 80% of such nanotubes, whereas the same term would not refer to less than about 80%. In these contexts, the defect level and the accorded meaning of the term "substantial" varies in accordance with the type of manufacturing process, the costs associated with such a process and the related defects and/or costs to avoid such defects, and any requirements in the end product.

Various plasma treatments as generally described herein involve methane plasma etching by way of example. However, other embodiments may be directed to the use of other amenable etch approaches in addition to and/or as an alternative to methane plasma etch.

The following discussion that is made in connection with many of the figures, as well as other discussion herein regarding other example embodiments and not necessarily involving the figures, often refers to approaches involving carbon nanotubes, their manufacture and their implementation. While discussed with carbon nanotubes, these approaches may be implemented with nanotubes having materials such as boron, or with nanotubes that have little or no carbon. In addition, for some applications, these approaches involve different etch materials and/or conditions to facilitate the implementation of such nanotubes with the particular described embodiments.

FIG. 1 is a flow diagram for an approach to manufacturing a nanotube electronic device, according to another example embodiment of the present invention. At block 110, a catalyst material is formed over a substrate at growth sites from which the nanotubes are to extend. At block 120, a plurality of nanotubes including both M-SWNTs and S-SWNTs are grown using catalyst material at the nanotube growth sites arranged, for example, relative to circuit locations at which the nanotubes are to be used. For instance, where carbon nanotubes are grown at block 110, the carbon nanotubes can be grown at block 120 via chemical vapor deposition (CVD) using, for example, methane at a temperature of about 750° C. In some applications, the grown SWNTs have diameters in a range of between about 1.0 nm and 1.8 nm, facilitated by growth conditions such as temperature and material used to make the growth possible. In certain applications, the nanotubes are grown at block 120 in an array across electrodes of a plurality of electronic devices, with one or more nanotubes grown for each of the devices. In some embodiments, the steps at blocks 110 and/or 120 are omitted, with a plurality of nanotubes including both M-SWNTs and S-SWNTs provided in another manner.

At block 130, after the SWNTs are grown, a plasma is introduced to the (as-grown) SWNTs at a temperature that facilitates the selective etching of the M-SWNTs. For instance, referring again to the above example involving carbon nanotubes, a methane plasma is introduced at block 130 to irreversibly etch the M-SWNTs into a hydrocarbon gas species via reactions with H-radicals and hydrocarbon-radicals in the plasma. In some applications involving carbon nanotubes, the grown SWNTs are etched at a temperature of about 400° C. to facilitate the selective etching of the M-SWNTs. In selectively etching M-SWNTs relative to S-SWNTs, the approach at block 130 uses the relatively higher electron density (and thus higher reactivity) of the M-SWNTs to facilitate their selective etching. In some applications, S-SWNTs of relatively small diameter (e.g., less than about 1.4 nm) are also selectively etched, using the higher radius of curvature and higher strain in the C—C bonding configuration exhibited by such relatively-small diameter S-SWNTs to facilitate the selective etching. With this approach, substantially all of the SWNTs (e.g., more than 90%, or about 100%) of the remaining SWNTs are S-SWNTs. In some applications, this selectivity is achieved using a selective etch that etches substantially few S-SWNTs (e.g., less than about 40%, less than about 20%, or less than about 5%) in a diameter range corresponding to the remaining S-SWNTs (e.g., between about 1.4 nm and an upper limit, such as 1.8 nm). In one embodiment, materials that are coupled to the remaining S-SWNTs are removed at block 140. For instance, where carbon S-SWNTs remain, species that are covalently bonded to the S-SWNTs, such as covalent C—$CH_3$ and C—H groups at sidewalls or ends of the nanotubes, are removed in an anneal. One implementation is directed to the annealing of the remaining S-SWNTs via de-methylation and dehydrogenation at a temperature of about 600° C. to eliminate covalently bounded groups from the S-SWNTs.

Figure 2:
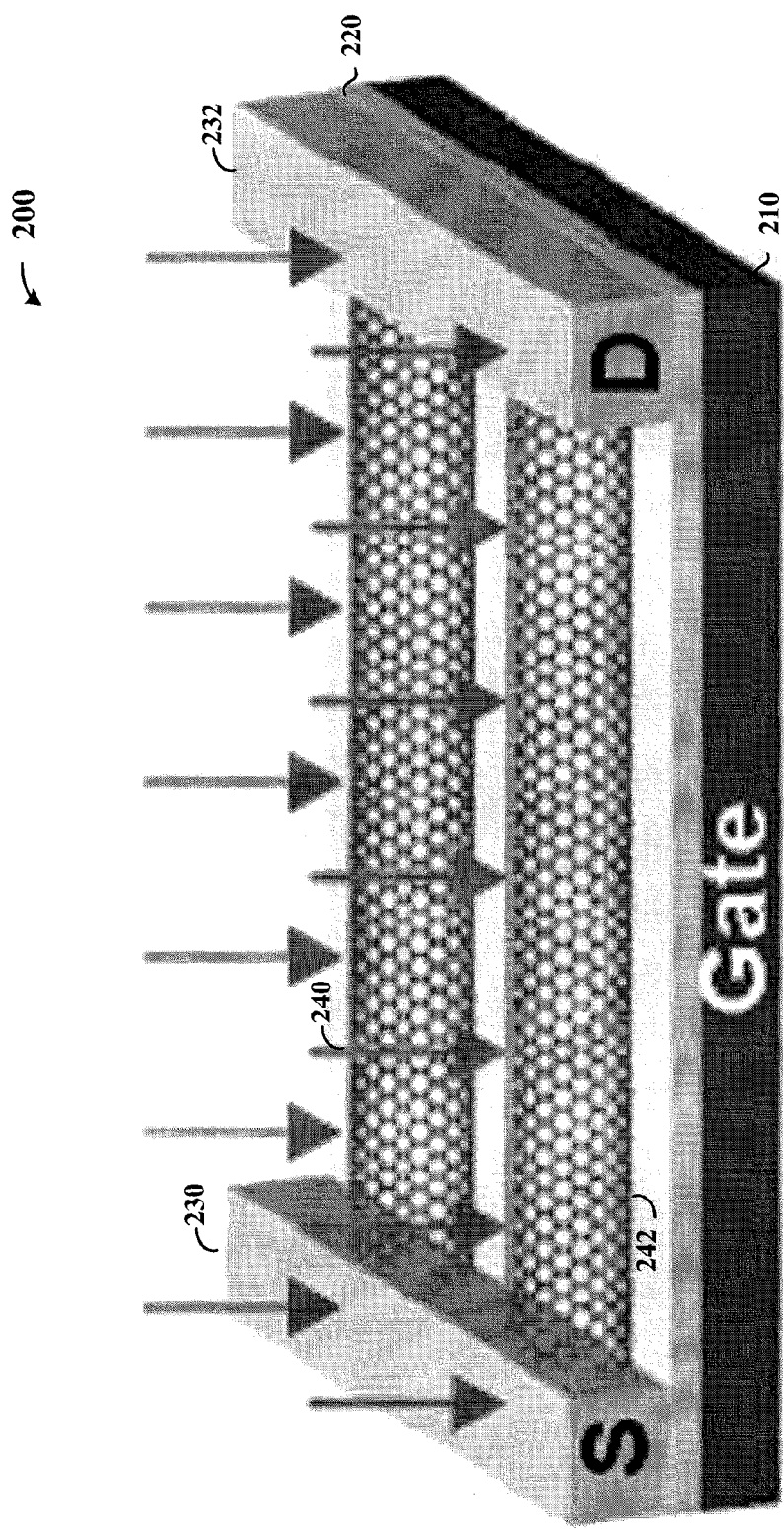
FIG. 2 shows an electronic device having SWNTs bridging electrodes, according to another example embodiment of the present invention.

FIG. 2 shows a FET device 200, according to another example embodiment of the present invention. The device 200 includes a substrate 210 as a back-gate, a dielectric layer 220 on the substrate, and source and drain electrodes 230 and 232 formed on the dielectric layer. The source and drain electrodes are implemented using a conductive material amenable to use with the particular application and processing characteristic, such as Ti/Au electrodes that facilitate high-temperature annealing. The distance between the source and drain electrodes is also varied to suit the particular application, and in some instances, is about 400 nm. The substrate 210 includes a material such as silicon that is amenable to use as a back-gate electrode, and the dielectric layer 220 includes a material such as $SiO_2$ at a thickness that facilitates application of the back-gate. For example, in one application, the dielectric layer 220 has a thickness of about 67 nm.

Two S-SWNTs 240 and 242 are formed to electrically couple the source and drain electrodes 230 and 232, and have characteristics related to their manufacture with one or more of the above approaches. In this regard, the source and drain electrodes 230 and 232 are coupled via S-SWNTs, without undesirable functionalization of the S-SWNTs (i.e., no undesirable covalently-bonded groups), and without M-SWNTs that may short the electrodes. The back-gate electrode in the substrate 210 is arranged to apply a bias voltage to the S-SWNTs 240 and 242, via the dielectric layer 220, to switch the FET device 200 between ON and OFF states to selectively pass current between the source and drain electrodes in the ON state.

In some applications, the S-SWNTs 240 and 242 may be manufactured using an approach similar to that shown in FIG. 1. That is, the S-SWNTs 240 and 242, as well as M-SWNTs, are grown between the source and drain electrodes 230 and 232. An etch approach, represented by downward-pointing arrows, is used to remove any M-SWNTs, resulting in the device 200 as shown. After removal of the M-SWNTs, the device 200 is annealed to remove any covalently-bonded groups from the S-SWNTs 240 and 242.

In another example embodiment, the FET device 200 is manufactured in an array of FET devices, with a multitude of S-SWNTs extending across source and drain electrodes in a manner similar to that shown, and in some applications, with one or more of the gate, source and drain coupled between devices. Subsequent processing is selectively implemented to electrically isolate or otherwise separate adjacent FET devices in the array. Such an approach may be implemented, for example, with an approach similar to those shown in and described in connection with FIGS. 3A and 3B.

In one implementation, hydrocarbonation etching is used to permanently remove metallic nanotubes from parallel arrays of SWNTs grown or assembled on full wafers in the fabrication of an array of FETs, similar to the FET device 200, each FET having source and drain regions coupled by substantially all-semiconducting SWNTs (e.g., at or near 100% S-SWNTs). A plurality of S-SWNTs and M-SWNTs having an upper diameter limit of approximately 1.6 nm are grown between the source and drain electrodes using a methane CVD with catalyst material (e.g., islands) to facilitate the growth. The SWNTs are then etched in a methane plasma to remove SWNTs having a diameter that is less than about 1.3 nm, and to remove substantially all M-SWNTs formed during the growth process. The resulting FET devices have source and drain electrodes coupled by S-SWNTs having a diameter in the range of 1.3-1.6 nm. This diameter range facilitates ohmic contact to the SWNTs, and further facilitates a bandgap of at least about 0.6 eV, which mitigates undesirable off-state leakage current. The S-SWNTs are then annealed to remove any covalently-bonded molecules. The resulting FET devices, such as FET device 200, exhibit on/off ratios of between about $10^4$ and $10^5$ at a drain-source voltage ($V_{ds}$) of about 1V.

In connection with the above discussion of FIG. 2 as well as other discussion herein as applicable to electronic circuits in general, and specifically to FET and FET-type devices, reference may be made to the following U.S. Patent Documents for various applications that may be implemented in connection with one or more embodiments of the present invention: U.S. Pat. No. 7,141,727 to Appenzeller et al., and U.S. Pat.

No. 7,091,096 to Balasubramanian et al. Both of these patent documents are fully incorporated herein by reference.

Figure 3A:
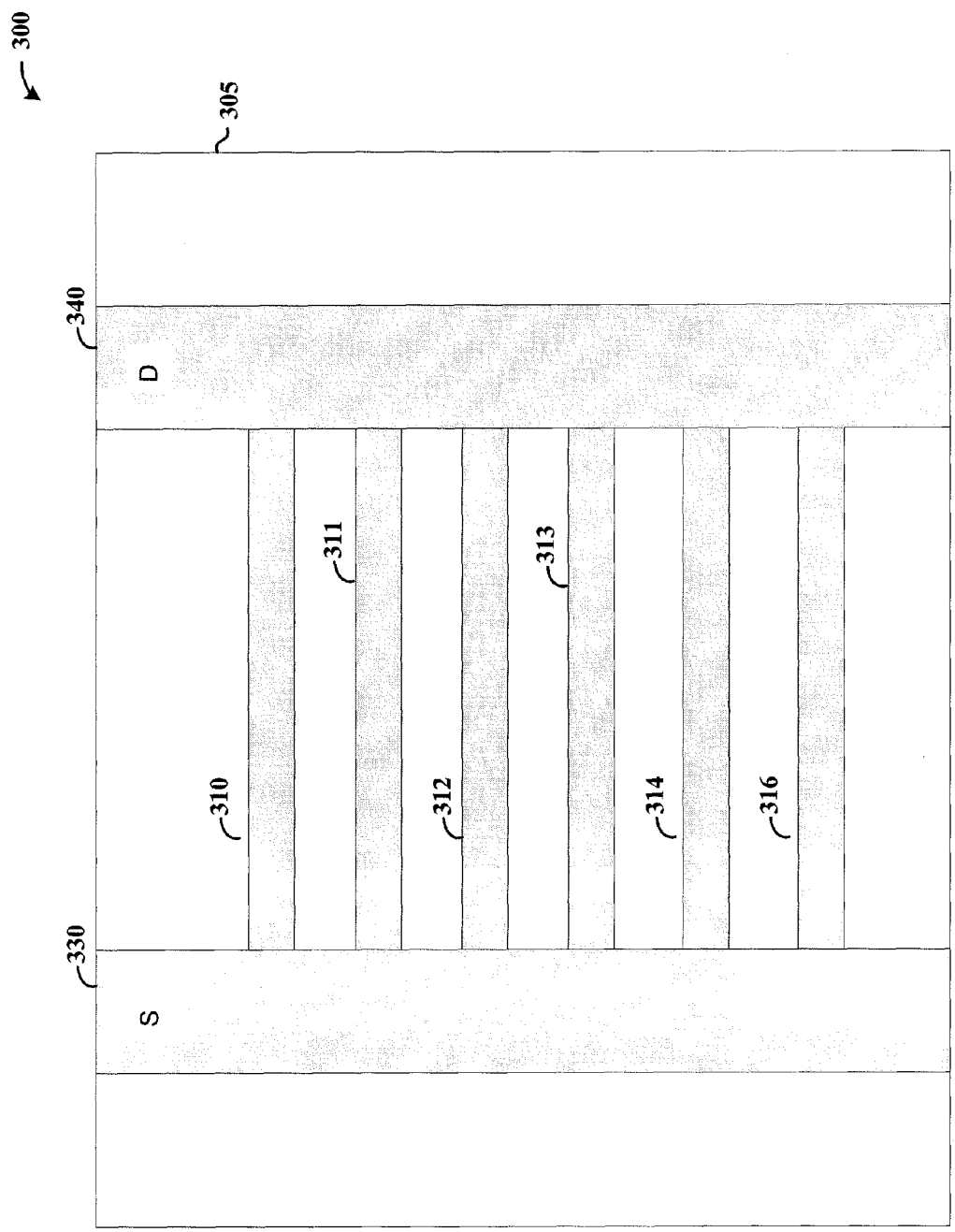
FIGS. 3A and 3B show a portion of an array of SWNT electronic devices at different stages of manufacture, according to another example embodiment of the present invention.
Figure 3B:
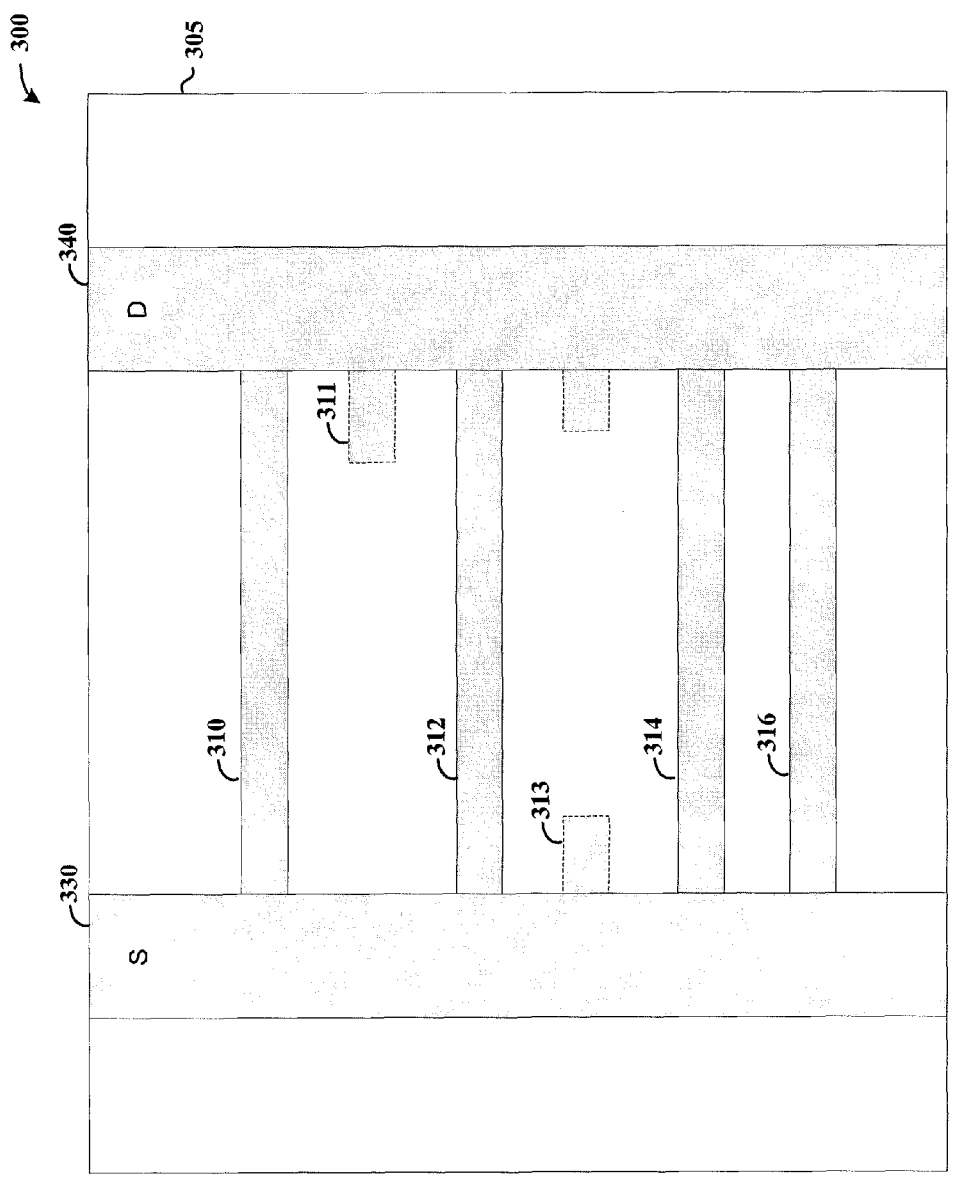

FIGS. 3A and 3B show a portion of an arrangement 300 of SWNT electronic devices at different stages of manufacture, according to another example embodiment of the present invention. Beginning with FIG. 3A, electrodes 330 and 340 are formed extending across a substrate 305 and catalyst material is formed on the electrodes. Where implemented in a manner consistent with FIG. 2, the substrate 305 includes an underlying substrate material that is used to form a back-gate, and a top layer of dielectric material, upon which the electrodes 330 and 340 are formed (as source and drain electrodes).

A plurality of SWNTs are grown extending across the electrodes 330 and 340, including S-SWNTs 310, 312, 314 and 316, and M-SWNTs 311 and 313. As discussed above, FIG. 3A shows a portion of the device 300, and as such the electrodes may be extended along their length; furthermore, a plurality of such electrode pairs may be formed on the substrate 305, with SWNTs grown across the additional electrode pairs in a similar manner.

At FIG. 3B, the SWNTs have been etched to break or remove M-SWNTs, including M-SWNTs 311 and 313, leaving substantially (or only) S-SWNTs behind. In some applications, the remaining S-SWNTs, including S-SWNTs 310, 312, 314 and 316, are annealed to remove any molecules covalently bonded thereto.

Referring again to FIG. 3B, in some embodiments, the removal of M-SWNTs 311 and 313 involves the etching of a portion of the M-SWNTs such that the M-SWNTs are discontinuous and thus do not electrically couple (e.g., short) the electrodes 330 and 340. As shown by way of example, a single end or root of M-SWNT 311 remains at electrode 340, and both ends or roots of M-SWNT 313 remain, one at each of electrodes 330 and 340. In this regard, the M-SWNTs are etched to remove at least a portion of the M-SWNTs, and the remaining portions generally do not adversely affect the performance of the arrangement 300 when implemented, for example, in an electronic circuit.

Figure 4:
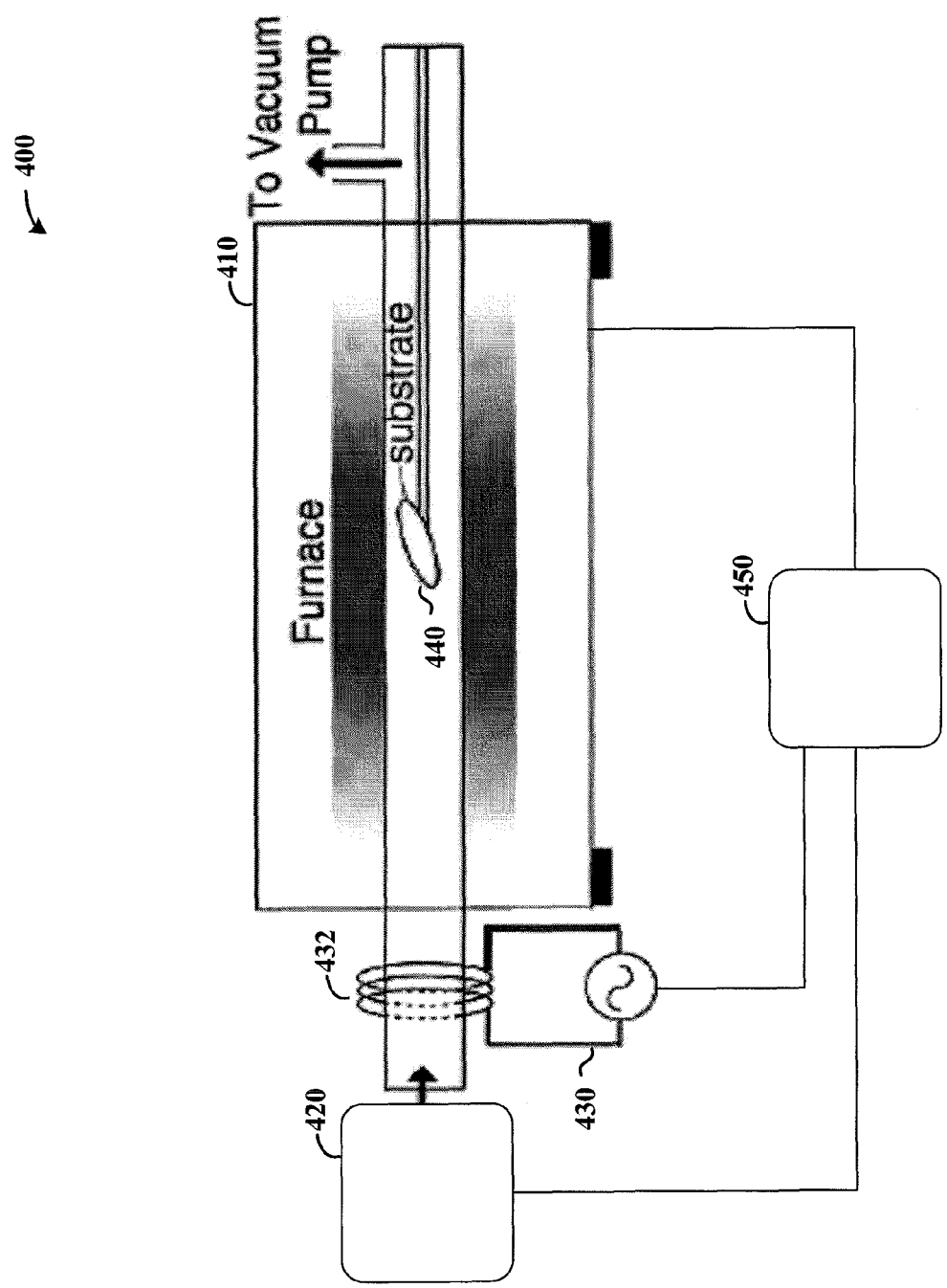
FIG. 4 shows an arrangement for manufacturing a SWNT electronic device, according to another example embodiment of the present invention.

FIG. 4 shows an arrangement 400 for manufacturing a SWNT electronic device, according to another example embodiment of the present invention. A tube furnace 410 is adapted for processing 4-inch wafers (e.g., having a diameter of approximately 5 inches). A gas supply 420 supplies an etch gas material such as methane (e.g., 80% $CH_4$ in Ar) to a plasma arrangement 430, which generates inductively-coupled plasma at the entrance of the furnace 410 using an RF coil 432 that operates at about 13.56 MHz.

The furnace 410 holds a substrate 440 with SWNTs, and heats to a desired temperature for etching. In some applications, the substrate 440 is located in the furnace 410 at a location away from an RF coil region 432 of the plasma arrangement 430 to avoid direct exposure to the generated plasma. The plasma is passed to the substrate 440 and used to etch M-SWNTs, leaving behind substantially S-SWNTs on the substrate 440. A controller 450 is programmed to control the furnace 410, gas supply 420 and plasma arrangement 430 to facilitate this etching, as well as to control other aspects of the system 400, where appropriate.

In some applications, the arrangement 400 is further adapted to draw a vacuum on the substrate 440, after etching, and heated to anneal the remaining S-SWNTs (e.g., with a low background pressure of molecular hydrogen). The anneal is carried out for a short period of time (e.g., 20 minutes) before being cooled down to room temperature.

In some applications, the arrangement 400 is also programmed and adapted to grow the nanotubes on the substrate 440, and to carry out the above etch approach on the grown nanotubes. For example, at the direction of the controller 450, the gas supply 420 can supply a carbon-containing gas that is used in a CVD process in the furnace 410, which heats to a temperature amenable to CVD growth of SWNTs in a desirable diameter range (e.g., to a temperature of about 400° C.). SWNTs are grown from the substrate 440, and the arrangement 400 operates to perform the etching as described above.

For general information regarding nanotubes and their implementation, and for specific information regarding information that is applicable in connection with one or more example embodiments of the present invention, reference may be made to Guangyu Zhang, Pengfei Qi, Xinran Wang, Yuerui Lu, Xiaolin Li, Ryan Tu, Sarunya Bangsaruntip, David Mann, Li Zhang, and Hongjie Dai, *Selective Etching of Metallic Carbon Nanotubes by Gas-Phase Reaction*, in *Science* Vol. 314, 974 (2006); and further to Qi et al., *Selective etching of metallic single-walled carbon nanotube-high current all semiconductor nanotube electronics*, a thesis available at Stanford University, Swain Chemistry and Chemical Engineering Library at 364 Lomita Drive, Organic Chemistry Building Stanford, Calif.; both of which are fully incorporated herein by reference.

For additional information regarding nanotubes, and for specific information regarding hydrogenation and hydrocarbonation approaches with nanotubes that may be implemented in connection with various example embodiments of the present invention, reference may be made to "Hydrogenation and Hydrocarbonation and Etching of Single-Walled Carbon Nanotubes," *J Am. Chem. Soc.* 2006, 128, 6026-6027, which is fully incorporated herein by reference.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, boron or other materials may be used with or in alternative to carbon nanotubes, and etch gases other than methane may be implemented with certain nanotubes. Such modifications and changes do not depart from the true spirit and scope of the present invention.

What is claimed is:

1. A method for manufacturing an electrical device, the method comprising:
   providing a plurality of single-walled nanotubes (SWNTs) extending between electrodes, the plurality of SWNTs including semiconducting single-walled nanotubes (S-SWNTs) and metallic single-walled nanotubes (M-SWNTs); and
   using a methane plasma at a temperature of about 400° C. to etch the M-SWNTs while retaining the S-SWNTs, whereby substantially none of the M-SWNTs electrically couple the electrodes.

2. A method for manufacturing an electrical device, the method comprising:
   providing a plurality of single-walled nanotubes (SWNTs) extending between electrodes, the plurality of SWNTs including semiconducting single-walled nanotubes (S-SWNTs) and metallic single-walled nanotubes (M-SWNTs); and
   using a methane plasma to selectively etch substantially all the M-SWNTs having a diameter that is less than an upper limit while retaining the S-SWNTs, whereby substantially none of the M-SWNTs electrically couple the electrodes.

3. The method of claim 2, further including, after etching the M-SWNTs, annealing the retained S-SWNTs to remove molecules covalently bonded thereto.

4. The method of claim 2, wherein providing a plurality of SWNTs extending between electrode includes providing the SWNTs extending between source and drain electrodes of a field-effect transistor (FET), wherein using a methane plasma to etch the M-SWNTs includes breaking a connection between the source and drain regions made by the M-SWNTs, and wherein the retained S-SWNTs form a channel region of the FET.

5. The method of claim 2, wherein using a methane plasma to etch the M-SWNTs while retaining the S-SWNTs includes rendering substantially all of the M-SWNTs electrically discontinuous.

6. The method of claim 2, wherein providing a plurality of SWNTs consists of providing SWNTs having a diameter that is less than about 1.8 nanometers and including providing at least one SWNT having a diameter of at least 1.2 nanometers.

7. The method of claim 2, wherein using a methane plasma to etch the M-SWNTs while retaining the S-SWNTs, includes etching substantially all of the SWNTs having a diameter that is less than about 1.2 nanometers, and etching substantially all of the M-SWNTs that are susceptible to etching via the methane plasma and having a diameter that is greater than about 1.2 nanometers, while retaining S-SWNTs having a diameter that is greater than about 1.2 nanometers.

8. The method of claim 2, wherein providing a plurality of SWNTs includes providing SWNTs having a diameter in a range of diameters that is greater than a diameter of S-SWNTs that are susceptible to etching with the methane plasma, and that is less than a diameter of M-SWNTs that are not susceptible to etching with the methane plasma.

9. The method of claim 2, wherein
providing a plurality of SWNTs includes providing SWNTs having a diameter in a range of between about 1.2 nanometers and 1.8 nanometers, and
using a methane plasma to etch the M-SWNTs while retaining the S-SWNTs includes etching M-SWNTs having a diameter in the diameter range while retaining S-SWNTs having a diameter in the diameter range.

10. The method of claim 2, wherein providing a plurality of SWNTs includes growing, from at least one of the electrodes, SWNTs having a diameter that is less than a diameter of M-SWNTs that are not susceptible to etching with the methane plasma.

11. The method of claim 2, wherein providing a plurality of SWNTs includes growing, from at least one of the electrodes, SWNTs having a diameter that is less than about 1.8 nanometers.

12. The method of claim 2, wherein using a methane plasma to etch the M-SWNTs while retaining the S-SWNTs includes using a methane plasma to etch substantially all M-SWNTs having a diameter that is less than an upper limit while retaining substantially all S-SWNTs also having a diameter that is less than the upper limit.

13. A method for manufacturing an electrical device, the method comprising:
providing a plurality of single-walled nanotubes extending between electrodes, the plurality of single-walled nanotubes including semiconducting single-walled nanotubes and metallic single-walled nanotubes that electrically couple the electrodes; and
using a methane plasma to etch the metallic single-walled nanotubes and selectively break the electrical continuity of substantially all of the metallic single-walled nanotubes, while retaining the semiconducting single-walled nanotubes.

14. The method of claim 13, wherein using a methane plasma includes using a methane plasma at a temperature of about 400° C.

* * * * *

UNITED STATES PATENT AND TRADEMARK OFFICE
CERTIFICATE OF CORRECTION

PATENT NO.        : 8,956,978 B1
APPLICATION NO.   : 11/830509
DATED             : February 17, 2015
INVENTOR(S)       : Dai et al.

Page 1 of 1

It is certified that error appears in the above-identified patent and that said Letters Patent is hereby corrected as shown below:

On the Title Page, Item (54) and in the Specification, Column 1, Lines 1-4.

In the Title

"SEMICONDUCTOR DEVICE, METHOD FOR MANUFACTURING SEMICONDUCTOR SINGLE-WALLED NANOTUBES, AND APPROACHES THEREFOR" should read --METHOD FOR MANUFACTURING SEMICONDUCTOR SINGLE-WALLED NANOTUBES EXTENDING BETWEEN ELECTRODES WITH SELECTIVELY ETCHING METALLIC SINGLE-WALLED NANOTUBES USING METHANE PLASMA--

Signed and Sealed this
Second Day of August, 2016

Michelle K. Lee
*Director of the United States Patent and Trademark Office*